United States Patent [19]
Wittlinger

[11] 3,916,346

[45] Oct. 28, 1975

[54] MODULATOR

[75] Inventor: Harold Allen Wittlinger, Pennington, N.J.

[73] Assignee: RCA Corporation, New York, N.Y.

[22] Filed: Dec. 5, 1974

[21] Appl. No.: 529,910

[52] U.S. Cl................ 332/31 R; 235/194; 307/229; 328/160; 330/30 R; 330/147

[51] Int. Cl.$^2$.... H03C 1/00; G06G 7/16; H03F 3/45

[58] Field of Search..... 332/31 R, 31 T, 43 B, 43 R; 331/108 D; 330/30 R, 147; 328/160; 307/229; 235/194

[56] References Cited

UNITED STATES PATENTS

| | | | |
|---|---|---|---|
| 3,283,135 | 11/1966 | Sklaroff | 330/147 X |
| 3,621,226 | 11/1971 | Wittlinger | 330/30 R |
| 3,805,184 | 4/1974 | Visioli et al. | 331/108 D |
| 3,851,276 | 11/1974 | Kaplan | 331/108 D |

*Primary Examiner*—Alfred L. Brody
*Attorney, Agent, or Firm*—H. Christoffersen; S. Cohen; R. G. Coalter

[57] ABSTRACT

An operational transconductance amplifier receives an input signal to be modulated at one of its inverting or non-inverting input terminals and a modulating signal at its transconductance control terminal. A signal proportioning circuit, also receptive of the modulating signal minimizes feedthrough of the modulating signal to the output terminal by applying a portion thereof to both the inverting and non-inverting input terminals.

6 Claims, 2 Drawing Figures

MODULATOR

This invention relates to modulators and particularly to modulators of the kind employing a controllable gain differential amplifier.

Controllable gain amplifiers are useful in a variety of analog signal processing applications. They may be used, for example to provide time example, gain control (TVG) which is essential in many sonar systems. In the broadcast industry they provide a convenient means or remotely controlling audio signal levels by direct current control signal lines which need not be shielded. Entertainment applications include musical instruments such as organs or the like where such amplifiers may be used to produce special effects such as tremulo, harmonic generation and so forth.

In many applications it is desirable that the controllable gain amplifier additionally provide differential amplification of two input signals supplied to it. Whether used in a single-ended or differential mode, however, it is generally required that the output signal faithfully represent the product of the amplifier gain control and input signals. In particular, in the absence of an input signal (or signals) the output signal should be zero whether or not the gain control signal is present. This is not completely achieved, unfortunately, in known controllable gain amplifiers which exhibit a small but finite "feedthrough" of the gain control (modulating) signal to the amplifier output terminal.

The present invention is directed to meeting the need for an improved controllable gain amplifier, operable in single-ended or differential modes and having substantially reduced feedthrough of the modulating signal.

An embodiment of the present invention includes a controllable gain differential amplifier which receives an input signal to be modulated at one of its input terminals and a modulating signal at its gain control terminal. A signal proportioning circuit, also receptive of the modulating signal minimizes feedthrough of the modulating signal to the output terminal by applying a portion thereof to the inverting and non-inverting amplifier input terminals.

The invention is illustrated in the accompanying drawings wherein.

Figure 1:
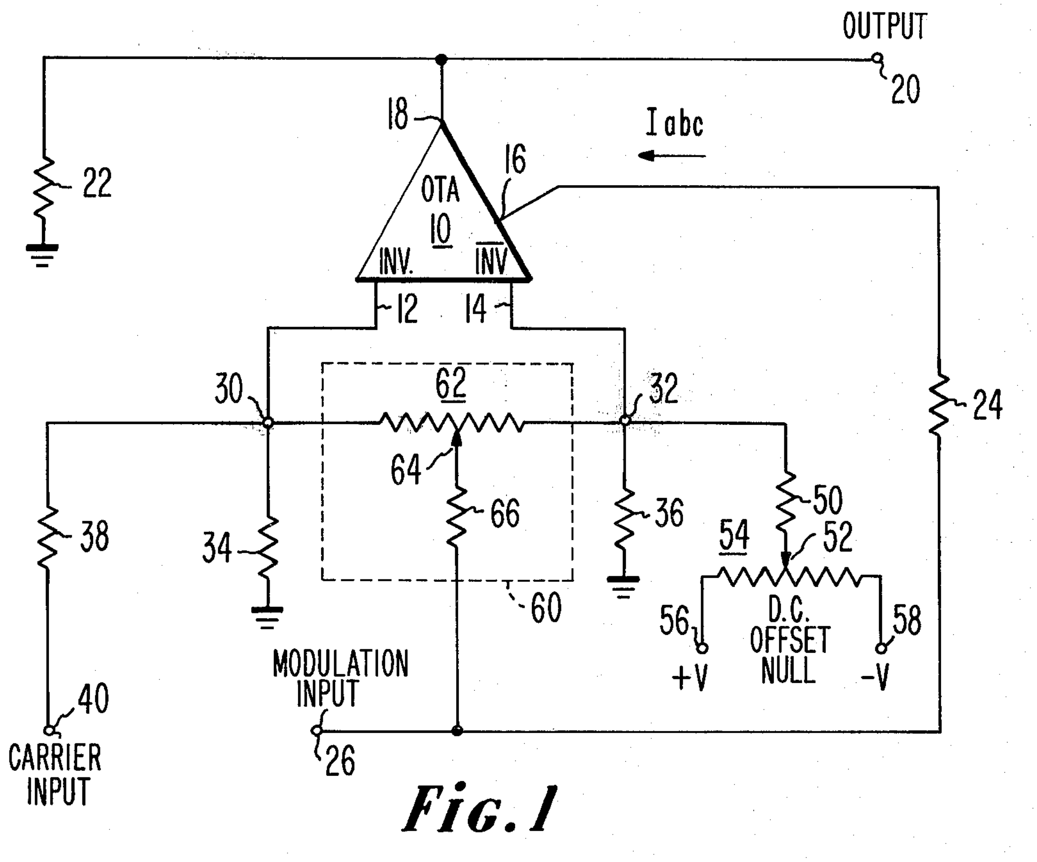
FIG. 1 is a circuit diagram of a modulator embodying the invention.

Amplifier 10 in FIG. 1 is a differential amplifier which, in addition to having the customary inverting 12 and non-inverting 14 input terminals, also has a gain control terminal 16. The amplifier belongs to the general class of controllable gain amplifiers and, in this embodiment, to the particular class of amplifiers capable of two-quadrant multiplication of an input difference function and a gain control function. It is helpful to an understanding of the present invention to review amplifier gain control techniques with particular attention to these specific requirements.

A wide variety of circuit techniques are known and used in implementing gain control of amplifiers. Two principal forms of gain controlled amplifiers (multipliers) presently widely used are the so-called pulse-width, pulse-height (PWPH) amplifier and the variable transconductance amplifier. In PWPH gain controlled amplifiers, the input functions $x$ and $y$ are used to modulate the width and height of an internally generated pulse waveform. Integration of the pulse waveform produces an output signal proportional to the pulse area and hence the product of the input functions. In variable transconductance amplifiers, the transconductance of a semiconductor device is made to vary in response to a control signal. Varying the transconductance when the amplifier is loaded with a fixed value load resistor thus varies the voltage gain. Where the load is reactive, as when the amplifier is used as an integrator in certain state-variable filter applications, varying the transconductance varies the integration time.

Either form of amplifier may be used in the present invention as long as it meets the requirement of having a gain which can be varied in response to changes in a control signal and the further requirement of being capable of amplifying the difference between two input signals. This may be accomplished by employing a separate differential amplifier having its output connected to one input terminal of a PWPH or variable transconductance multiplier. A better (more economical) approach, however, is to employ a variable gain differential amplifier which performs both circuit functions. Operational transconductance amplifiers, such as the RCA CA3080 are presently available which perform the functions of both differential amplification and gain control (multiplication). The CA3080, for example, has a transconductance (and hence a voltage gain) proportional to a bias current supplied to its control terminal. Its gain is substantially zero for zero or negative bias (two quadrant operation). Further details of such amplifiers are presented in an Application Note ICAN-6668 entitled "Applications of the CA3080 and CA3080A High-Performance Operational Transconductance Amplifiers" which was authored by the present inventor and published by RCA Corporation in March 1972. It will be assumed for the purposes of the present discussion that amplifier 10 is an operational transconductance amplifier of the kind described in the aforementioned application note.

Load resistor 22, which is connected between the amplifier output terminal 18 and ground, determines a parameter of the amplifier voltage gain. Specifically, if the conductance of this resistor is substantially greater than the admittance of any other load (not shown) connected between the circuit output terminal 20 and ground, the amplifier differential voltage gain (i.e., its gain relative to the difference between input signals applied to terminals 12 and 14) will be substantially equal to the product of its transconductance, $gm$, and the value of resistor 22 ($R_L$). This load resistor may be omitted in applications where the load admittance itself is of a value to yield the desired voltage gain.

Bias current limiting resistor 24, which is connected between gain control terminal 16 and modulation signal input terminal 26, provides and limits the value of amplifier bias current, $I_{abc}$, supplied to gain control terminal 16 in response to the modulation input signal. The transconductance of amplifier 10 is substantially zero when Iabc is zero and increases for increasing values thereof. Neglecting nonlinearities in the amplifier's gain control input terminal characteristics, the value of $I_{abc}$ is approximately equal to the value of the modulating voltage divided by the value of resistor 24, so that the amplifier voltage gain is proportional to the modulating voltage. This resistor may be omitted, of course, where the modulation input signal is obtained from a current source (i.e., one having a relatively high source resistance) rather than a voltage source (i.e., one having a relatively low source resistance).

First and second circuit points (30 and 32, respectively) which are connected to inverting and non-inverting input terminals 12 and 14, respectively, serve as signal summing points. It is the potential difference across these points which represents the amplifier differential-mode input signal. The amplifier common-mode input signal corresponds to the common voltage between each circuit point and ground. As will be explained in detail below, these circuit points are used to accept a balanced or unbalanced differential-mode input signal representative of the carrier input signal to be modulated and an unbalanced common mode input signal proportional to the modulating input signal. Additionally, these points receive a common-mode reference potential and may receive a differential-mode direct current offset correcting signal.

First and second current summing resistors 34 and 36, respectively, which are connected between ground and first and second circuit points 30 and 32, respectively, provide two functions. First, these resistors provide a common-mode reference potential to the input terminals of amplifier 10. This provides quiescent bias signals for the amplifier. Where the amplifier is transformer coupled or capacitively coupled, other suitable means should be included to perform this function. Second, these resistors provide the function of summing the carrier, modulating and offsetting currents supplied to circuit points 30 and 32, and producing output voltages proportional thereto. Current summing techniques are used in this example of the invention because of their low cost and relative simplicity. These summing resistors may be omitted, of course, where voltage summing is preferred. For example, the various signals to be summed may be applied to a suitable transformer having a centertapped secondary connected to circuit points 30 and 32 with the center tap returned to a suitable potential reference point. Summing would then be accomplished by addition (or subtraction) of magnetic flux in the transformer. This technique, which is discussed in more detail with regard to the embodiment of FIG. 2, has the advantage of eliminating a common-mode voltage component due to the modulating signal.

Carrier signal current limiting resistor 38, which is connected between circuit point 30 and carrier input terminal 40, applies the input signal to be modulated to the first current summing resistor. Where the carrier signal is obtained from a low impedance signal source the value of this resistor should be large compared with that of summing resistor 34 for minimizing interaction with the common-mode signal proportioning circuit 60 to be described. Resistor 38 may be omitted where the source impedance of the carrier signal is substantially greater than the value of resistor 34.

Offset limiting resistor 50, which is connected between the second circuit summming point 32 and wiper 52 of direct current offset null potentiometer 54, applies a relatively small direct current bias signal to summing resistor 36. The purpose of this bias is to correct for input offset errors in amplilfier 10. Its polarity, positive or negative, and magnitude will depend upon the offset of the particular amplifier employed and is adjusted by appropriately positioning wiper 52 on D.C. offset null potentiometer 54 which is connected across positive and negative reference potential sources 56 and 58 respectively. Resistor 50, potentiometer 54 and the positive and negative reference sources may be omitted in applications where the input offset characteristics of amplifier 10 are within acceptable limits for the particular application concerned. Such may be the case, for example, in relatively low gain, alternating current coupled circuit applications.

Signal proportioning circuit 60 comprises a feed-through null potentiometer 62 connected between the first and second circuit points 30 and 32, respectively, with the wiper 64 thereof connected by current limiting resistor 66 to modulation input terminal 26. The purpose of the signal proportioning circuit is to provide a relatively small proportion of the modulating signal to each of circuit points 30 and 32. These signals, summed in resistors 34 and 36, respectively, with the carrier input signal and the D.C. offset null signal respectively are applied to the inverting and non-inverting amplifier input terminals. With wiper 64 centered, the summed modulation signals are equal valued and a small common mode input voltage is presented to the amplifier. Repositioning the wiper in either direction unbalances the common mode input signals so that either the inverting or the non-inverting input terminal will receive a greater proportion thereof. That is, as the wiper is rotated through its midpoint position, a 180° phase reversal of the amplified modulation input signals occurs, the magnitude thereof increasing with the deviation from the midpoint. It is this phase reversal and controllable magnitude of the amplified modulating input signal by which the feedthrough component of the modulating signal (terminal 16 to terminal 18) can be effectively reduced over a substantial range of values of the modulating signal. The correction thus provided is not perfect, of course, since the amplifier transconductance varies with the value of the modulating signal so there will be regions of under and over correction of the feedthrough. Nevertheless, measured values of reduced feedthrough in excess of 14 dB have been observed in laboratory tests of the RCA type CA3080 operational transconductance amplifier.

Adjustment of the modulator of FIG. 1 is as follows. With no carrier or modulating signals applied, D.C. offset null potentiometer 54 is adjusted to minimize the output voltage at output terminal 20. The modulating input signal is then applied with the wiper of feed-through null potentiometer nominally centered and the feedthrough of the modulating signal observed at output terminal 20. Potentiometer 62 is then adjusted to minimize the feedthrough. This procedure may be reiterated as needed to achieve optimum rejection of the modulating signal. Since feedthrough is not a problem when the modulating input signal is zero, the above adjustment is preferably done either at the maximum expected value of the modulating signal or at its most probable expected value, whichever suits the needs of the particular signal processing application concerned.

In summary, in the embodiment of FIG. 1 operational transconductance amplifier 16 receives a carrier signal to be modulated at one of its input terminals and a modulating input signal at its gain (transconductance) control terminal. Signal proportioning circuit 60, also receptive of the modulating signal minimizes feed-through of the modulating signal to the amplifier output terminal by applying a portion of the modulating signal to both the inverting and non-inverting input terminals.

The carrier input circuit of the example of FIG. 1 has been illustrated as having an unbalanced bridging input. This input may also be balanced bridging, balanced terminating, or unbalanced terminating. For example, for an unbalanced terminating input, a line terminating resistor (not shown) may be connected between carrier input terminal 40 and ground. For balanced bridging inputs, a further carrier input terminal would be connected by a further resistor (equal in value to resistor 38) to the second circuit point 32. For balanced terminating inputs, carrier input terminal 40 and the further carrier input terminal would be connected to ground by separate line terminating resistors.

Figure 2:
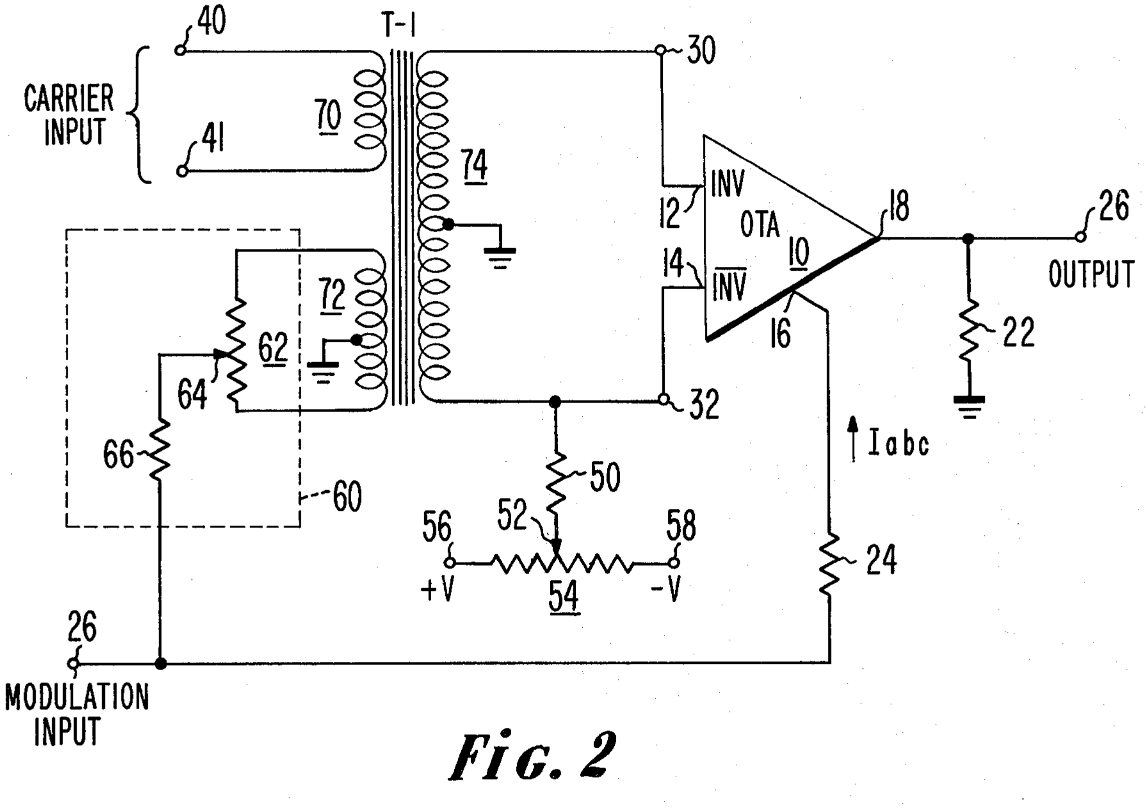
FIG. 2 is a circuit diagram illustrating a modification of the modulator of FIG. 1.

The modulator of FIG. 2 is similar to that of FIG. 1 but employs transformer summing of the carrier and modulating signals rather than the resistor summing techniques previously discussed. Advantages of this method include elimination of the common-mode components of the modulaating signal at the amplifier input terminals which here receive only a differential mode component of the modulating signal in addition to the carrier and D.C. offset signals. Also the carrier is received by a balanced bridging input which may (by the addition of one or two resistors) be made balanced terminating. This balanced input suppresses common mode components of the carrier input signal.

In more detail, in FIG. 2 resistors 38, 34 and 36 have been eliminated and a three winding transformer T-1 added. Carrier input terminal 40 and a further carrier input terminal 41 are connected to the first primary winding 70 of transforer T-1. Feedthrough null potentiometer 62 which was formerly connected across circuit points 30 and 32 is now connected across the second primary winding 72 of transformer T-1. The center tap of this winding is grounded. The secondary winding 74 to transformer T-1 is connected to circuit points 30 and 32 and also has a grounded center tap.

Operation of the modulator of FIG. 2 is similar to that of FIG. 1 except that the common-mode component of the modulating signal which previously appeared at circuit points 30 and 32 is now rejected by transformer T-1. The differential mode modulating signal (additive or subtractive depending upon the position of wiper 64) is added to the carrier signal by a summation of magnetic flux in the transformer rather than a summation of currents in a resistor. The procedure for adjustment of potentiometers 54 and 62 is identical to that previously described. It should be noted that the D.C. offset circuit here is substantially the same as that of FIG. 1 with the resistance of the secondary winding between the center tap and circuit point 32 serving (insofar as the D.C. offset signal is concerned) the purpose of resistor 36. In other words, the current provided by offset current limiting resistor 50 passes through a portion of the transformer secondary winding to produce the D.C. offset correction signal at one input terminal of amplifier 10.

It will be appreciated in each of the embodiments that load resistor 22 may be eliminated. If it is, the output signal at output terminal 20 will be an output current, rather than a voltage, the value of the current being dependent on the carrier and modulation input signals. The "modulator" then is well suited for application as an integrator having a controllable time constant by connecting its output to a reactive load as may be done in certain active filter applications (such as the so-called state variable filters).

What is claimed is:

1. A modulator comprising, in combination:

controllable differential amplifier means having inverting and non-inverting input terminals, a control terminal responsive to a control signal for varying a gain controlling parameter of said amplifier and an output terminal for producing an output signal proportional to the product of the difference between input signals supplied to said input terminals and the magnitude of said control signal;

means for applying a first input signal to be modulated to at least one of said input terminals;

means for applying a second input signal to said control terminal for varying said gain controlling parameter in accordance with variations thereof thereby modulating said first input signal;

signal proportioning circuit means also receptive of said second input signal and coupled to said input terminals, for applying portions of said second input signal to both of said input terminals; and means in said proportioning circuit for controlling the proportions of said second input signal which each input terminal receives.

2. The modulator recited in claim 1 wherein said signal proportioning circuit means and said means in said proportioning circuit comprises:

potentiometer means having a resistive member and a wiper in contact therewith, said wiper being manually positionable across at least a portion of the surface of said resistive member;

first means for coupling said resistive member across said inverting and non-inverting input terminals; and second means for applying a current proportional to said second input signal to said wiper.

3. The modulator recited in claim 2 wherein said controllable differential amplifier comprises an operational transconductance amplifier having a transconductance which varies in accordance with an amplifier bias current supplied to said control terminal, said amplifier bias current being proportional to said second input signal.

4. The modulator recited in claim 2 wherein said first means comprises a three winding transformer, said transformer having a first winding for receiving said first input signal, a second winding coupled to said resistive element of said potentiometer for receiving said second input signal and a third winding coupled to said inverting and non-inverting input terminals for applying said first and second signals thereto.

5. A modulator comprising, in combination:

an operational transconductance amplifier having inverting and non-inverting input terminals at least one of which is receptive of a carrier signal to be modulated, an output terminal for producing a modulated output signal and a transconductance control terminal for receiving a modulation input signal;

signal proportioning circuit means, also receptive of said modulation input signal, and coupled to said input terminals, for applying said modulation input signal to both of said input terminals; and means in said signal proportioning circuit for controlling the proportion of said modulation signal which each said input terminal receives.

6. The modulator recited in claim 5 wherein said signal proportioning circuit means comprises a resistive member connected across said inverting and non-inverting input terminals and wherein said means in said signal proportioning circuit comprises moveable contact means in contact with said resistive member and receptive of said modulating signal.

* * * * *